(12) United States Patent
Yu

(10) Patent No.: US 7,795,720 B1
(45) Date of Patent: Sep. 14, 2010

(54) INVERSELY ALTERNATE STACKED STRUCTURE OF INTEGRATED CIRCUIT MODULES

(75) Inventor: Hong-Chi Yu, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 0 days.

(21) Appl. No.: 12/458,134

(22) Filed: Jul. 1, 2009

(30) Foreign Application Priority Data

Jun. 5, 2009 (TW) .............................. 98118641 A

(51) Int. Cl.
*H01L 23/02* (2006.01)
(52) U.S. Cl. ...................................... 257/686; 257/724
(58) Field of Classification Search ................. 257/723, 257/724, 686, 777; 438/117
See application file for complete search history.

(56) References Cited

U.S. PATENT DOCUMENTS

| | | | | |
|---|---|---|---|---|
| 6,320,253 | B1 * | 11/2001 | Kinsman et al. ............ | 257/686 |
| 6,943,443 | B2 * | 9/2005 | Nobori et al. ............... | 257/704 |
| 2003/0085474 | A1 * | 5/2003 | Frankowsky et al. ........ | 257/777 |
| 2005/0161797 | A1 * | 7/2005 | Miller ........................ | 257/686 |
| 2006/0261491 | A1 * | 11/2006 | Soeta et al. .................. | 257/777 |
| 2008/0054434 | A1 * | 3/2008 | Kim ........................... | 257/686 |

* cited by examiner

*Primary Examiner*—S. V Clark
(74) *Attorney, Agent, or Firm*—Bacon & Thomas, PLLC

(57) ABSTRACT

An inversely alternate stacked structure of integrated circuit (IC) modules includes at least one IC module, and at least a spring strip set. The IC module contains a substrate, at least an IC chip and a molding body, in which the substrate has an inner surface and an outer surface, at least an external contact pad is provided on one end of the outer surface, and at least a switch contact pad is provided on the other end of the outer surface, the external contact pad and the switch contact pad are disposed in an inversely symmetrical manner. The spring strip set has at least a non-flat structure. The external contact pad of an IC module is electrically connected with the switch contact pad of another IC module via the electrical contact of the non-flat structure so that the IC modules are integrated to form an inversely alternate stacked structure.

27 Claims, 5 Drawing Sheets

INVERSELY ALTERNATE STACKED STRUCTURE OF INTEGRATED CIRCUIT MODULES

FIELD OF THE INVENTION

The present invention relates to a stacked structure of integrated circuit (IC) modules, and more particularly to a single-sided inversely alternate stacked structure.

BACKGROUND OF THE INVENTION

With reference to FIG. 1, a conventional stack-type IC module structure has a plurality of pads (311) disposed on the upper and the lower surfaces of a substrate (31) (or called chip carrier), conducting through the upper and lower surfaces, and soldered and electrically connected with a plurality of joints (312) such that the IC module structure (3) can be longitudinally stacked and electrically conducted. Generally, those joints (312) can be selected from one of a solder ball, a bump, a metal column, and a lead as disclosed in Taiwan Patent No. 1240394 'Semiconductor package structure adapted to 3D package' and Taiwan Patent No. 1245385 'Stackable ball grid array package structure of multi-chip module'. However, the count of the longitudinal stack varies with the function expansion, and the thickness of the overall stacked structure is inconsistent, making that the structure fails to be applied to light, thin, short and tiny electronic products, e.g. micro memory device. Besides, in the past the longitudinally stacked IC modules are electrically conducted by using the joints (312) to bond with the pads (311). Therefore, the step requiring the connection through the joints (312) in production process inevitably make the reduction of assembly processes and production cost-down impossible. Moreover, when the longitudinally stacked structure is subjected to a stress, the joints (312) are easily destructed due to shock. This further leads to interior signal connection quality among those IC modules. Above all, owing to the high temperature arising from chip operation, the conventional IC module structure (3) is prone to the issue of bad heat dissipation.

SUMMARY OF THE INVENTION

In view of the foregoing concern, in accordance with the first aspect of the present invention an inversely alternate stacked structure of IC modules is provided. The substrate of the IC module has an outer surface which is not covered by a molding body. At least an external contact pad is formed on one end of the outer surface, and at least a switch contact pad is formed on the other end of the outer surface, in which the external contact pad of an IC module is electrically contacted with the switch contact pad of another contact pad so that the IC modules form an inversely alternate stacked structure, that is, the IC modules take the form of single-sided inversely alternate contact pattern to form a two-layer IC modules with an inversely alternate stacked structure, which allows to horizontally extend and connect a plurality of IC modules so as to expand memory capacity in a limited height.

In accordance with the second aspect of the present invention, an inversely alternate stacked structure of IC module, which includes at least one IC module and at least a spring strip set, is provided. The substrate of the IC module has an outer surface which is not covered by a molding body. At least an external contact pad is formed on one end of the outer surface, and at least a switch contact pad is formed on the other end of the outer surface. The spring strip set has at least a non-flat structure. The external contact pad of an IC module is electrically contacted with the switch contact pad of another IC module via the electrical contact of the non-flat structure of the spring strip set so that the IC modules form an inversely alternate stacked structure. As a result, the mounted spring strip set will help absorb and be a buffer when the stacked structure is subjected to a stress. Thus, the IC modules have better shock-absorbent ability to maintain good signal connection quality.

In accordance with the third aspect of the present invention, an inversely alternate stacked structure of IC module, which includes at least one IC module and at least a spring strip set, is provided. The substrate of the IC module has an outer surface, which is not covered by a molding body. At least an external contact pad is formed on one end of the outer surface, and at least a switch contact pad is formed on the other end of the outer surface. The spring strip set has at least a non-flat structure. The external contact pad of an IC module is electrically contacted with the switch contact pad of another IC module via the electrical contact of the non-flat structure of the spring strip set so that the IC modules form an inversely alternate stacked structure. As a result, the IC modules have better heat-dissipating effect by mounting the spring strip set.

In accordance with the fourth aspect of the present invention, an inversely alternate stacked structure of IC module, which includes at least one IC module and at least a spring strip set, is provided. The substrate of the IC module has an outer surface, which is not covered by a molding body. At least an external contact pad is formed on one end of the outer surface, and at least a switch contact pad is formed on another end of the outer surface. The spring strip set has at least a non-flat structure. The external contact pad of an IC module is electrically contacted with the switch contact pad of another IC module via the electrical contact of the non-flat structure of the spring strip set so that the IC modules form in an inversely alternate stacked structure. As a result, the assembly process requires no relevant steps which go through contact points of the joints, thereby making the function approving or size upgrading process more simplified and convenient and reducing the production cost.

To achieve the aforementioned aspects, the primary technical means of the present invention employs the following technical solution to implement. The present invention is an inversely alternate stacked structure of IC module, including: at least one IC module, having a substrate, at least an IC chip, a molding body, wherein the substrate has an inner surface and an outer surface, at least an external contact pad is provided at one end of the outer surface, at least a switch contact pad is provided at the other end of the outer surface, the external contact pad and the switch contact pad are disposed in an inversely symmetrical pattern and are electrically connected, and the molding body is formed on the inner surface of the substrate to seal the IC chip; and at least a spring strip set having at least a non-flat structure, wherein the external contact pad of one IC module is electrically connected with the switch contact pad of the other IC module by electrically contacting with the non-flat structure of the spring strip set so that the IC modules is in the form of an inversely alternate stacked structure.

Preferably, the IC module is a memory module.

Preferably, the IC module is made from a thermosetting molding compound.

Preferably, the spring strip set is joined with one side of the IC module in the proximity of the switch contact pad by an engagement means so that the non-flat structure is in touch with the switch contact pad.

Preferably, the spring strip set is joined with one side of the IC module in the proximity of the external contact pad by an engagement means so that the non-flat structure is in touch with the external contact pad.

Preferably, the non-flat structure is constituted by odd protrusions.

Preferably, the non-flat structure is constituted by a plurality of square teeth.

Preferably, the non-flat structure is constituted by a plurality of arches.

Preferably, the non-flat structure is constituted by a plurality of round teeth.

Preferably, the non-flat structure is constituted by a plurality of bumps.

Preferably, the spring strip set is detachably connected with the IC module in an inserted or detached state.

Preferably, the external contact pad and the switch contact pad are a metal contact.

Preferably, the non-flat structure of the spring strip set is made of copper.

Preferably, the non-flat structure of the spring strip set is made of aluminum.

In contrast to the prior art, the efficacy of the present invention lies in that the IC modules exhibit an single-sided inversely alternate contact pattern by electrically contacting the external contact pad of an IC module with the switch contact pad of another IC module so as to form two-layer IC modules having an inversely alternate stacked structure. This allows horizontally extending and connecting a plurality of IC modules to expand memory space within a limited height. Furthermore, the way that the present invention employs the non-flat structure of the spring strip set to contact with the IC module so as to electrically conduct between the IC modules is totally different from the way that conventional longitudinal stacked structure electrically conducts by using the joints to combine with the pads. As such, there can be no soldering spot on the joined surface of the IC modules in accordance with the present invention, such that the function approving or size upgrading process becomes more simplified and convenient and the production cost can further go down. When the stacked structure is subjected to a stress, better shock-absorbent ability is provided between the IC modules to maintain good signal connection quality. In addition, the IC modules have better heat-dissipating efficacy by virtue of the installation of the spring strip set.

The foregoing and other features and advantages of the present invention will be more clearly understood through the following descriptions with reference to the drawing, wherein:

BRIEF DESCRIPTION OF THE DRAWINGS

FIG. 4-1 is a cross-sectional view showing a non-flat structure of the spring strip set in contact with an external contact pad in accordance with the present invention;

FIG. 4-2 is a cross-sectional view showing the non-flat structure of the spring strip set in contact with an switch contact pad in accordance with the present invention;

FIG. 9-1 is a cross-sectional view showing the non-flat structure in the form of a plurality of bumps in accordance with the present invention; and FIG. 9-2 is a cross-sectional view A-A of FIG. 9-1 in accordance with the present invention.

DETAILED DESCRIPTION OF THE PREFERRED EMBODIMENT

It is to be noted that the following descriptions of preferred embodiments of this invention are presented herein for purpose of illustration and description only; it is not intended to be exhaustive or to be limited to the precise form disclosed.

The present invention will now be described more specifically with reference to the following embodiments.

Figure 2:
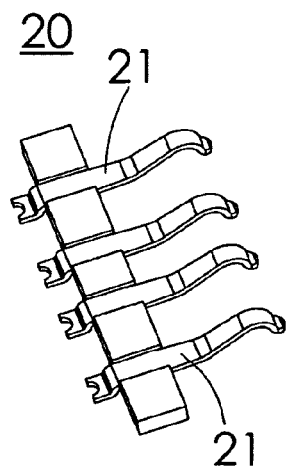
FIG. 2 is a perspective view of a spring strip in accordance with the present invention.
Figure 3:
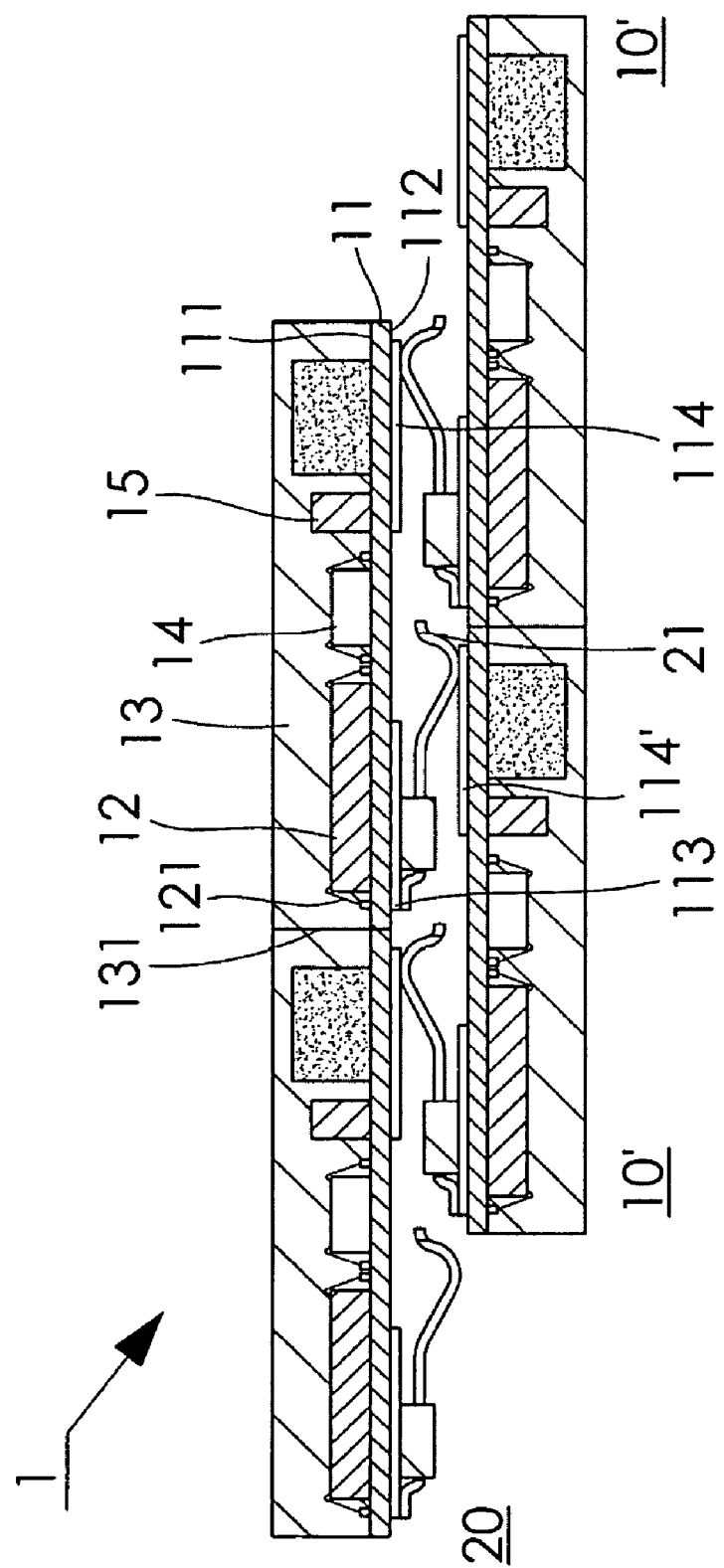
FIG. 3 is a cross-sectional view showing an inversely alternate stacked structure of a IC module in accordance with the present invention.

With reference to FIGS. 2 and 3, an inversely alternate stacked structure of IC module mainly includes at least one IC module (10) having a substrate (11), at least an IC chip (12) and a molding body (13), and at least a spring strip set (20). The substrate (11) serves as a chip carrier and a transmission interface. The substrate (11) having an inner surface (111) and an outer surface (112) can be a high-density multi-layer printed circuit board that conducts through both sides and has a circuit (not shown) formed internally. The inner surface (111) specifies an encapsulated surface, and the outer surface (112) is an exposed surface which is located outside the IC module structure and is opposite to the inner surface (111). At least an external contact pad (113) is formed on one end of the outer surface (112), and at least a switch contact pad (114) is formed on the other end of the outer surface (112).

The external contact pad (113) and the switch contact pad (114) are disposed in an inversely symmetrical manner, and the external contact pad (113) is electrically connected with the switch contact pad (114) by virtue of the circuit (not shown) of the substrate (11), in which the external contact pad (113) and the switch contact pad (114) can be metal contact. The IC chip (12) is mounted on the inner surface (111) of the substrate (11) and is electrically connected to the external contact pad (113). The solder wire (121) formed by wire bonding or the flip chip bonding technique can be employed to electrically connect the IC chip (12) to the substrate (11). Normally, the IC chip (12) can be a FLASH memory, a SRAM (Static-Random-Access-Memory), an ASIC (Application-Specific-Integrated-Circuit) or a SDRAM (Synchronous-Dynamic-Random-Access-Memory).

In the present preferred embodiment, the components disposed on the inner surface (111) of the substrate (11) further includes an access control chip (14) and at least a passive component (15), in which the access control chip (14) is electrically connected to the IC chip (12), the external contact pad (113) and the switch contact pad (114), and is able to control the saving and reading operation of the IC chip (12), detect if the switch contact pad (114) is connected with another IC module (10') and transmit control signals to the IC module (10'). The passive component (15) can be used to protect the access control chip (14) and the IC chip (12) or enhance electrical function. The molding body (13) is formed on the inner surface (111) of the substrate (11) by molding or printing technique so as to seal the IC chip (12) and the access control chip (14).

In different preferred embodiment, the access control chip (14) can be integrated with the IC chip (12) to form a SOC (System-On-Chip). A spring strip set (20) has at least a non-flat structure 21. In the stacked structure of the present invention, the external contact pad (113) of the IC module (10) is electrically connected with the switch contact pad (114') of the IC module (10') via the non-flat structure (21) of the fastener (20). As a consequence, the IC modules (10, 10') exhibit a single-sided inversely alternate connection manner and form two-layer IC modules having an inversely alternate stacked structure. After stacking, the overall thickness can be maintained and controlled around the thickness of two IC modules (10), and thus at the expansion request of memory, more inversely alternate stacked structures (1) of IC modules in the horizontal direction can be connected unlimitedly.

Figure 1:
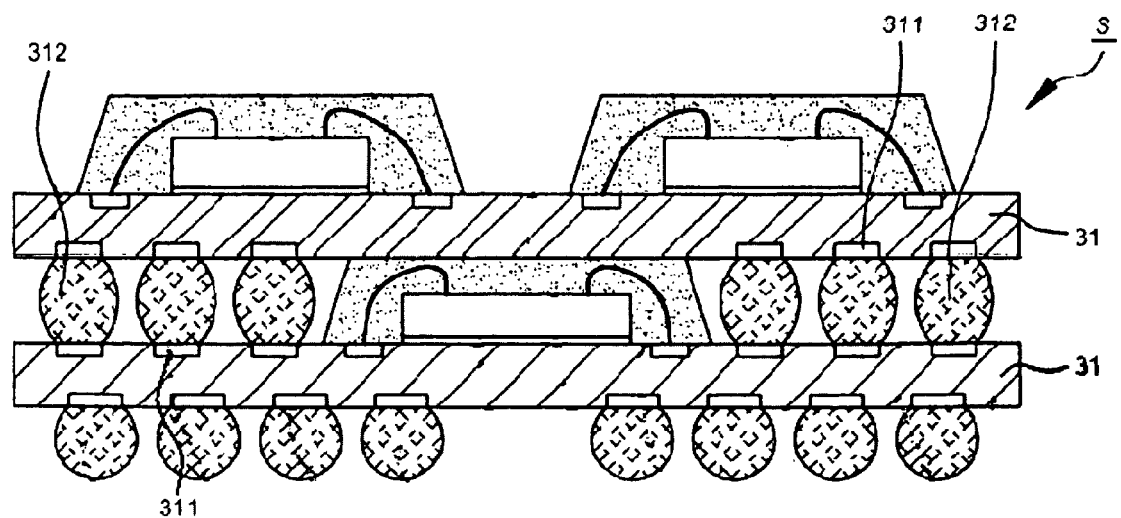
FIG. 1 is a cross-sectional view showing a longitudinal stacked structure of a conventional IC module.
Figures 1, 4:
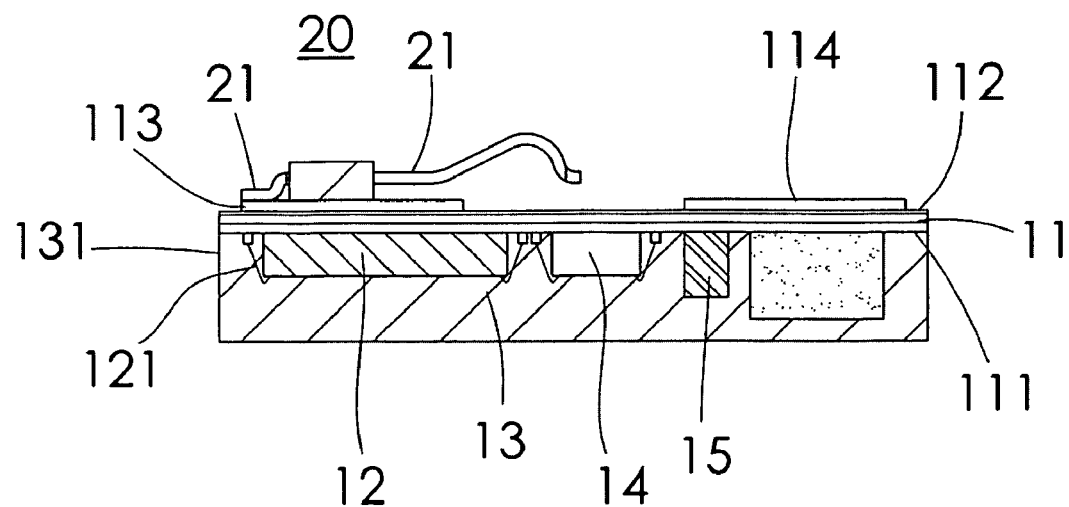
Figures 2, 4:
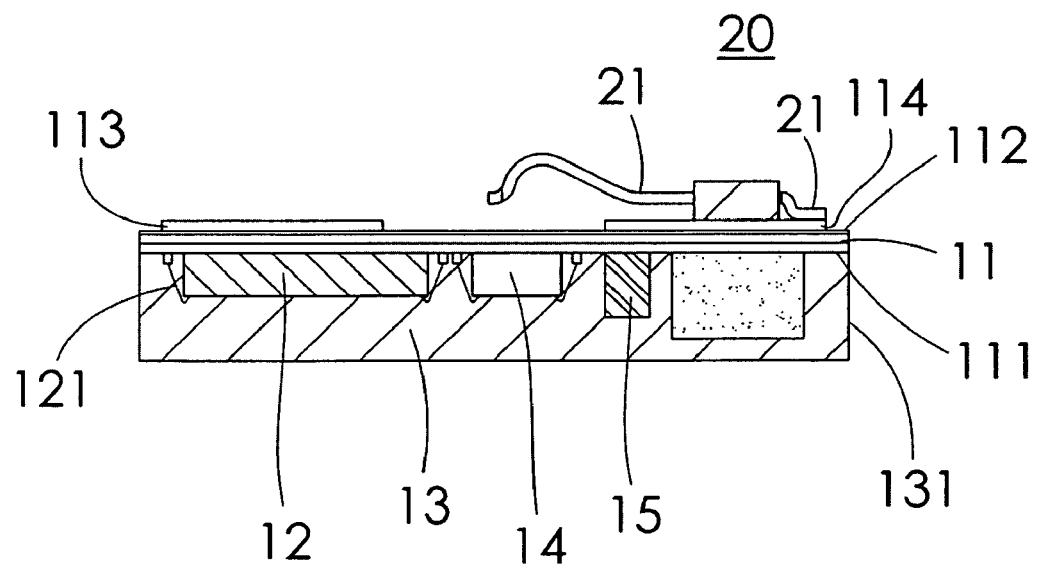
Figure 5:
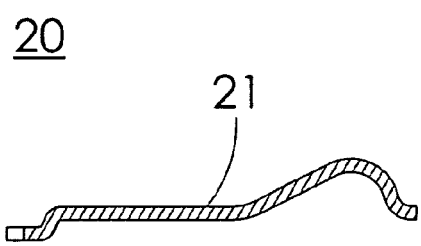
FIG. 5 is a cross-sectional view showing the non-flat structure in the form of singular protrusion in accordance with the present invention.
Figure 6:
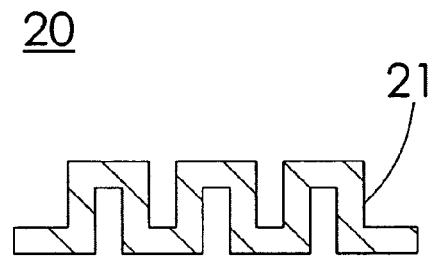
FIG. 6 is a cross-sectional view showing the non-flat structure in the form of a plurality of square teeth in accordance with the present invention.
Figure 7:
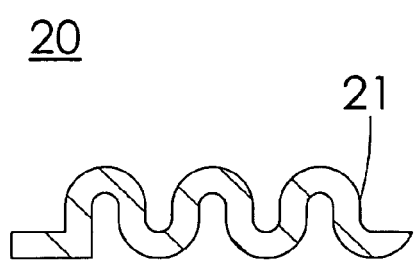
FIG. 7 is a cross-sectional view showing the non-flat structure in the form of a plurality of arches in accordance with the present invention.
Figure 8:
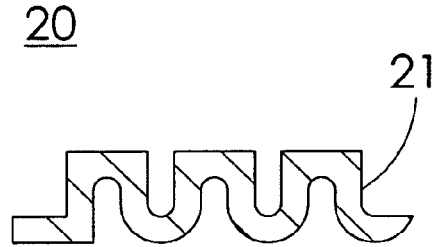
FIG. 8 is a cross-sectional view showing the non-flat structure in the form of a plurality of round teeth in accordance with the present invention.
Figures 1, 9:
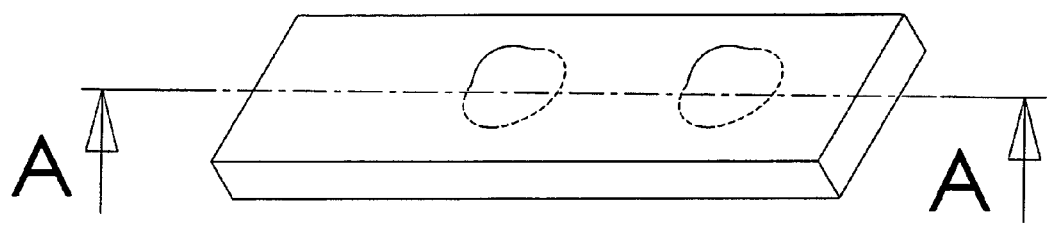
Figures 2, 9:
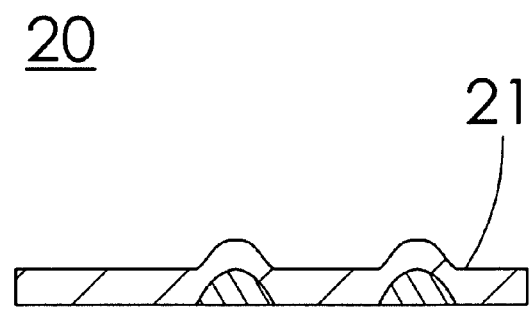

The spring strip set (20) is joined with one side of the IC module in the proximity of the external contact pad (113) by an engagement means (not shown) so that the non-flat structure (21) is in touch with the external contact pad (113) (as shown in FIG. 4-1). Alternatively, the spring strip set (20) can be joined with one side of IC module in the proximity of the switch contact pad (114) by an engagement means (not shown) so that the non-flat structure is in touch with the switch contact pad (114) (as shown in FIG. 4-2) for electrically conducting upon being plugged. However, the joining method is not limited to the engagement means. Regardless of pivoting method, joining by tenon, snap fitting, locking and embedding usually employed by the IC industry, any means enabling the spring strip set (20) to be joined can be adopted as wished. Moreover, the shape of the non-flat structure (21) can be in the form of singular protrusion (as shown in FIG. 5), a plurality of square teeth (as shown in FIG. 6), a plurality of arches (as shown in FIG. 7), a plurality of round teeth (as shown in FIG. 8), a plurality of bumps (as shown in FIGS. 9-1 and 9-2) or the random combination of other unlisted singular or plural forms. Consequently, when the external contact pad of one IC module is in contact with the switch contact pad of another IC module by virtue of the electrical contact of the non-flat structure of the spring strip set and the inversely alternate stacked structure (1) of the IC module is subjected to a stress, energy can be absorbed by the deformation of the non-flat structure (21) to provide a stress-damping effect. This allows the IC module (10) to have better shock-absorbent ability and maintain good signal connection quality. Meanwhile, owing to no soldering spot on the joined surface of the IC modules (10), the function approving or size upgrading process becomes more simplified and convenient and the production cost can further go down without requiring to go through the relevant steps of contact points of the joints (312) (as shown in FIG. 1). Furthermore, the non-flat structure of the spring strip set can be also made of copper, aluminum or other metal so as to provide better heat-dissipating effect to dissipate heat generated during the operation of the IC modules (10). The spring strip set (20) can be detachably connected with the IC module (10) either in an inserted or detached state. The IC module (10) described in the present invention can be a module made from a thermosetting molding compound and can be a memory module, and the memory module can also be a module made from a thermosetting molding compound.

In sum, given the electrical contact between the external contact pad of a IC module and the switch contact pad of another IC module, the IC modules in the present invention are aligned in a single-sided inversely alternate contact manner in formation of two-layer IC modules with an inversely alternate stacked structure, so that a plurality of IC modules can be connected and stretched out in a horizontal direction to expand memory capacity within a limited height. Furthermore, because the external contact pad of one IC module is electrically connected with the switch contact pad of another IC module by the non-flat structure of the spring strip set, better shock-absorbent ability between the IC modules can be provided to maintain good signal connection quality when the stacked structure is subjected to a stress. These IC modules have better heat-dissipating efficacy by virtue of the installation and form design of the non-flat structure of the spring strip set. In addition, owing to no soldering spot on the joined surface of the IC modules, the function approving or size upgrading process becomes more simplified and convenient and the production cost can further go down.

As such, the way that the present invention employs the spring strip set to contact with the IC module so as to electrically conduct between the IC modules is totally different from the way that the conventional longitudinal stacked structure electrically conducts by using the joints to combine with the pads, and its function also differs from that of the regular conventional longitudinal stacked structure. The present invention provides the practical and innovative value to the industry and the application is hereby submitted in accordance with the patent laws.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An inversely alternate stacked structure of IC modules, comprising:
at least one IC module, having a substrate, at least an IC chip and a molding body, wherein the substrate has an inner surface and an outer surface, at least an external contact pad is provided at one end of the outer surface, at least a switch contact pad is provided at the other end of the outer surface, the external contact pad and the switch contact pad are disposed in an inversely symmetrical manner and are electrically connected, and the molding body is formed on the inner surface of the substrate to seal the IC chip; and
at least a spring strip set having at least a non-flat structure, wherein the external contact pad of one of the IC modules is electrically connected with the switch contact pad of the other IC module by electrically contacting with the non-flat structure of the spring strip set so that the IC modules is in the form of an inversely alternate stacked structure.

2. The inversely alternate stacked structure of IC module as claimed in claim 1, wherein the IC module is a memory module.

3. The inversely alternate stacked structure of IC module as claimed in claim 1, wherein the IC module is made from a thermosetting molding compound.

4. The inversely alternate stacked structure of IC module as claimed in claim 2, wherein the IC module is made from a thermosetting molding compound.

5. The inversely alternate stacked structure of IC module as claimed in claim 1, wherein the spring strip set is joined with one side of the IC module in the proximity of the switch contact pad by an engagement means so that the non-flat structure is in touch with the switch contact pad.

6. The inversely alternate stacked structure of IC module as claimed in claim 1, wherein the spring strip set is joined with one side of the IC module in the proximity of the external contact pad by an engagement means so that the non-flat structure is in touch with the external contact pad.

7. The inversely alternate stacked structure of IC module as claimed in claim 1, wherein the non-flat structure is constituted by singular protrusion.

8. The inversely alternate stacked structure of IC module as claimed in claim 5, wherein the non-flat structure is constituted by singular protrusion.

9. The inversely alternate stacked structure of IC module as claimed in claim 6, wherein the non-flat structure is constituted by singular protrusion.

10. The inversely alternate stacked structure of IC module as claimed in claim 1, wherein the non-flat structure is constituted by a plurality of square teeth.

11. The inversely alternate stacked structure of IC module as claimed in claim 5, wherein the non-flat structure is constituted by a plurality of square teeth.

12. The inversely alternate stacked structure of IC module as claimed in claim 6, wherein the non-flat structure is constituted by a plurality of square teeth.

13. The inversely alternate stacked structure of IC module as claimed in claim 1, wherein the non-flat structure is constituted by a plurality of arches.

14. The inversely alternate stacked structure of IC module as claimed in claim 5, wherein the non-flat structure is constituted by a plurality of arches.

15. The inversely alternate stacked structure of IC module as claimed in claim 6, wherein the non-flat structure is constituted by a plurality of arches.

16. The inversely alternate stacked structure of IC module as claimed in claim 1, wherein the non-flat structure is constituted by a plurality of round teeth.

17. The inversely alternate stacked structure of IC module as claimed in claim 5, wherein the non-flat structure is constituted by a plurality of round teeth.

18. The inversely alternate stacked structure of IC module as claimed in claim 6, wherein the non-flat structure is constituted by a plurality of round teeth.

19. The inversely alternate stacked structure of IC module as claimed in claim 1, wherein the non-flat structure is constituted by a plurality of bumps.

20. The inversely alternate stacked structure of IC module as claimed in claim 5, wherein the non-flat structure is constituted by a plurality of bumps.

21. The inversely alternate stacked structure of IC module as claimed in claim 6, wherein the non-flat structure is constituted by a plurality of bumps.

22. The inversely alternate stacked structure of IC module as claimed in claim 1, wherein the spring strip set is detachably connected with the IC module in an inserted or detached state.

23. The inversely alternate stacked structure of IC module as claimed in claim 5, wherein the spring strip set is detachably connected with the IC module in an inserted or detached state.

24. The inversely alternate stacked structure of IC module as claimed in claim 6, wherein the spring strip set is detachably connected with the IC module in an inserted or detached state.

25. The inversely alternate stacked structure of IC module as claimed in claim 1, wherein the external contact pad and the switch contact pad are a metal contact.

26. The inversely alternate stacked structure of IC module as claimed in claim 1, wherein the non-flat structure of the spring strip set is made of copper.

27. The inversely alternate stacked structure of IC module as claimed in claim 1, wherein the non-flat structure of the spring strip set is made of aluminum.

* * * * *